US012651794B2

(12) United States Patent
Wei et al.

(10) Patent No.: US 12,651,794 B2
(45) Date of Patent: Jun. 9, 2026

(54) FLEXIBLE ELECTRODE, DISPLAY APPARATUS AND WEARABLE DEVICE

(71) Applicant: BOE Technology Group Co., Ltd., Beijing (CN)

(72) Inventors: Yuehan Wei, Beijing (CN); Yue Cui, Beijing (CN); Hong Zhu, Beijing (CN); Bo Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 443 days.

(21) Appl. No.: 18/274,489

(22) PCT Filed: Oct. 22, 2021

(86) PCT No.: PCT/CN2021/125849
§ 371 (c)(1),
(2) Date: Jul. 27, 2023

(87) PCT Pub. No.: WO2022/205861
PCT Pub. Date: Oct. 6, 2022

(65) Prior Publication Data
US 2024/0136626 A1 Apr. 25, 2024

(30) Foreign Application Priority Data
Mar. 30, 2021 (CN) .......................... 202110340581.3

(51) Int. Cl.
*H01M 50/238* (2021.01)
*G06F 1/16* (2006.01)
(Continued)

(52) U.S. Cl.
CPC .......... *H01M 50/238* (2021.01); *G06F 1/163* (2013.01); *H01M 50/247* (2021.01);
(Continued)

(58) Field of Classification Search
CPC ............ H01M 50/238; H01M 50/247; H01M 50/503; G06F 1/163; H05K 1/0283; H05K 1/141
See application file for complete search history.

(56) References Cited

U.S. PATENT DOCUMENTS 6,380,710 B1 4/2002 Watanabe et al.
2014/0360560 A1 12/2014 Taniguchi et al.
(Continued)

FOREIGN PATENT DOCUMENTS

CN 102945873 A 2/2013
CN 104040730 A 9/2014
(Continued)

OTHER PUBLICATIONS

CN202110340581.3 first office action.
PCT/CN2021/125849 international search report.

*Primary Examiner* — Sarah A. Slifka
(74) *Attorney, Agent, or Firm* — IPro, PLLC

(57) ABSTRACT
Disclosed in the present disclosure are a flexible electrode, a display apparatus and a wearable device, which are used for avoiding the defects, such as bubbles, wrinkles and cracks, which occur in an area between adjacent energy storage units, during a bending process of a flexible battery. A flexible battery is provided in the embodiments of the present disclosure. The flexible battery comprises: a supporting layer; a flexible conductive layer, which is located on one side of the supporting layer; a plurality of energy storage units, which are arranged at intervals, in a first direction, on the side of the flexible conductive layer that is away from the supporting layer, and are electrically connected to the flexible conductive layer; and a first package structure, which comprises a protruding portion covering the energy storage units, and a recessed portion located between the adjacent energy storage units.

18 Claims, 8 Drawing Sheets

(51) Int. Cl.
    *H01M 50/247*     (2021.01)
    *H01M 50/503*     (2021.01)
    *H05K 1/02*     (2006.01)
    *H05K 1/14*     (2006.01)

(52) U.S. Cl.
    CPC ........ *H01M 50/503* (2021.01); *H05K 1/0283*
                (2013.01); *H05K 1/141* (2013.01)

(56)             References Cited

U.S. PATENT DOCUMENTS

| | | | |
|---|---|---|---|
| 2016/0155873 | A1 | 6/2016 | Aspnes et al. |
| 2017/0213927 | A1 | 7/2017 | Pilat |
| 2018/0331247 | A1 | 11/2018 | Lee et al. |
| 2021/0249549 | A1 | 8/2021 | Gaume et al. |

FOREIGN PATENT DOCUMENTS

| | | |
|---|---|---|
| CN | 204614798 U | 9/2015 |
| CN | 106299002 A | 1/2017 |
| CN | 106575682 A | 4/2017 |
| CN | 112189264 A | 1/2021 |
| KR | 101674629 B1 | 11/2016 |

18(23)

16

24

17

15

4

3

2

1

2

3

19

X

25 e     d     e

FLEXIBLE ELECTRODE, DISPLAY APPARATUS AND WEARABLE DEVICE

CROSS REFERENCE TO RELATED APPLICATION

The present application is a US National Stage of International Application No. PCT/CN2021/125849, filed on Oct. 22, 2021, which claims the priority to Chinese Patent Application No. 202110340581.3, filed with the Chinese Patent Office on Mar. 30, 2021 and entitled "FLEXIBLE ELECTRODE, DISPLAY APPARATUS AND WEARABLE DEVICE", which is incorporated in its entirety herein by reference.

TECHNICAL FIELD

The present disclosure relates to the technical field of batteries, and in particular to a flexible electrode, a display apparatus and a wearable device.

BACKGROUND

How to solve the problem of power shortage of a wearable device has become a focus of current research in the field of flexibility. In recent years, with high energy density and long cycle life, a lithium ion battery has been widely used in the field of a portable product, a standby power supply, an electric vehicle, etc. In the related art, a flexible battery is a bamboo-shaped battery divided into a plurality of sections. Different sections are connected by means of a single layer of flexible plane electrodes to form a multi-section flexible battery. A rigid area is an energy storage part of the battery and is unbendable, while a flexible area is a flexible electrode and is bendable. Flexibility of the entire battery is achieved by means of local bending and local rigidity at multiple positions. However, the defects, such as bubbles, wrinkles and cracks, will occur around a rigid unit and at a junction of the rigid unit during use of the bamboo-shaped battery. If the bamboo-shaped battery continues being used, these defects will continue deepening to cause liquid leakage of the battery, resulting in battery failure.

SUMMARY

A flexible electrode, a display apparatus and a wearable device are provided in embodiments of the present disclosure, which are used for avoiding the defects, such as bubbles, wrinkles and cracks that occur in an area between adjacent energy storage elements during a bending process of a flexible battery.

A flexible battery is provided in the embodiments of the present disclosure. The flexible battery includes: a supporting layer; a flexible conductive layer on a side of the supporting layer; a plurality of energy storage elements, arranged at intervals, in a first direction, on a side of the flexible conductive layer away from the supporting layer, and electrically connected to the flexible conductive layer; and a first package structure, including a protruding portion covering the energy storage elements and a recessed portion between the adjacent energy storage elements, where an elastic modulus of the first package structure ranges from 30 MPa to 100 MPa.

In some embodiments, an elastic modulus of the first package structure ranges from 40 MPa to 50 MPa.

In some embodiments, a thickness of the first package structure in a direction perpendicular to the supporting layer ranges from 150 microns to 200 microns.

In some embodiments, the first package structure includes: a first barrier layer; a first metal layer on a side of the first barrier layer away from the energy storage element; a first bonding layer on a side of the first metal layer away from the first barrier layer; a second barrier layer on a side of the first bonding layer away from the first metal layer; and a third barrier layer on a side of the second barrier layer away from the first bonding layer.

In some embodiments, a material of the first barrier layer includes polypropylene, a material of the first metal layer includes aluminum, a material of the second barrier layer includes nylon, and a material of the third barrier layer includes a resin.

In some embodiments, the flexible battery further includes: a second package structure on a side of the supporting layer away from the first package structure, where the elastic modulus of the second package structure ranges from 30 MPa to 100 MPa; the flexible conductive layer is further on a side of the supporting layer close to the second package structure, and the plurality of energy storage elements are further on a side of the flexible conductive layer close to the second package structure.

In some embodiments, a distance between any two adjacent energy storage elements is equal in the first direction.

In some embodiments, a battery capacity $C_{unit}$ of each of the energy storage elements satisfies the following condition:

$$C_{unit} = A \times t \times e \times (W - f),$$

where $\Delta$ is a volume energy density of the energy storage element, t is a thickness of the first conductive layer, e is a width of the energy storage element in the first direction, W is a width of the supporting layer in a direction perpendicular to the first direction, and f is a distance between an edge of the supporting layer extending in the first direction and the energy storage element.

In some embodiments, a width e of the energy storage element in the first direction satisfies the following condition:

$$e = \frac{c_{unit}}{\Delta \times t \times (W - f)} + a,$$

where $C_{unit}$ is a battery capacity of each of the energy storage elements, $\Delta$ is a volume energy density of the energy storage element, t is a thickness of the first conductive layer, W is a width of the supporting layer in a direction perpendicular to the first direction, f is a distance between an edge of the supporting layer extending in the first direction and the energy storage element, and a is a thickness of the first package structure in a direction perpendicular to the flexible conductive layer.

In some embodiments, a battery capacity $C_{unit}$ of each of the energy storage elements satisfies the following condition:

$$C_{unit} = \frac{C_{total}}{N},$$

where $C_{total}$ is a total capacity of the flexible battery, and N is the number of energy storage elements.

In some embodiments, a minimum bending radius r of the flexible conductive layer, a distance d between two adjacent energy storage elements, and a width e of the energy storage element in the first direction satisfy the following condition:

$$2\sin\left(\frac{d}{4\rho} + \frac{1}{2}\alpha\right) - \sin\alpha - \frac{dr - es}{2\rho(s+r)}\cos\alpha = 0,$$

where d is a distance between two adjacent energy storage elements, s is a distance between a neutral surface of the flexible conductive layer in a bent state and an unbent state, α is an included angle between two adjacent energy storage elements on two sides of a bending position in the bent state of the flexible conductive layer, and ρ is a local bending radius of the flexible conductive layer.

A display apparatus is provided in the embodiment of the present disclosure. The display apparatus includes: a display substrate; and the flexible battery that is located on one side of the display substrate according to the embodiments of the present disclosure.

In some embodiments, the display apparatus further includes: a casing on a side of the flexible battery away from the display substrate, and on a side of the first package structure away from the supporting layer.

In some embodiments, the casing is provided with a plurality of first recesses accommodating the protruding portion of the first package structure.

In some embodiments, the display apparatus includes the plurality of flexible batteries on one side of the display substrate, where the plurality of flexible batteries are on the same plane, and the plurality of flexible batteries are electrically connected to each other by means of a flexible circuit board.

In some embodiments, the casing is further provided with a second recess, and an orthographic projection of the second recess on the display substrate covers an area between two adjacent flexible batteries; and the display apparatus further includes: a main board, electrically connected to the flexible circuit board, and located in the second recess.

In some embodiments, two side surfaces of the second recess parallel to the first direction are provided with a first opening and a second opening respectively; the first opening exposes a startup button of the main board; and the second opening exposes a charging end of the main board.

A wearable device is provided in the embodiment of the present disclosure. The wearable device includes the flexible battery according to the embodiment of the present disclosure on one side of the display substrate.

BRIEF DESCRIPTION OF FIGURES

In order to describe the technical solutions in the embodiments of the present disclosure more clearly, the accompanying drawings required for describing the embodiments are briefly described below. Obviously, the accompanying drawings in the following description show merely some embodiments of the present disclosure, and those of ordinary skill in the art would further be able to derive other accompanying drawings from these accompanying drawings without making creative efforts.

DETAILED DESCRIPTION

Figure 1:
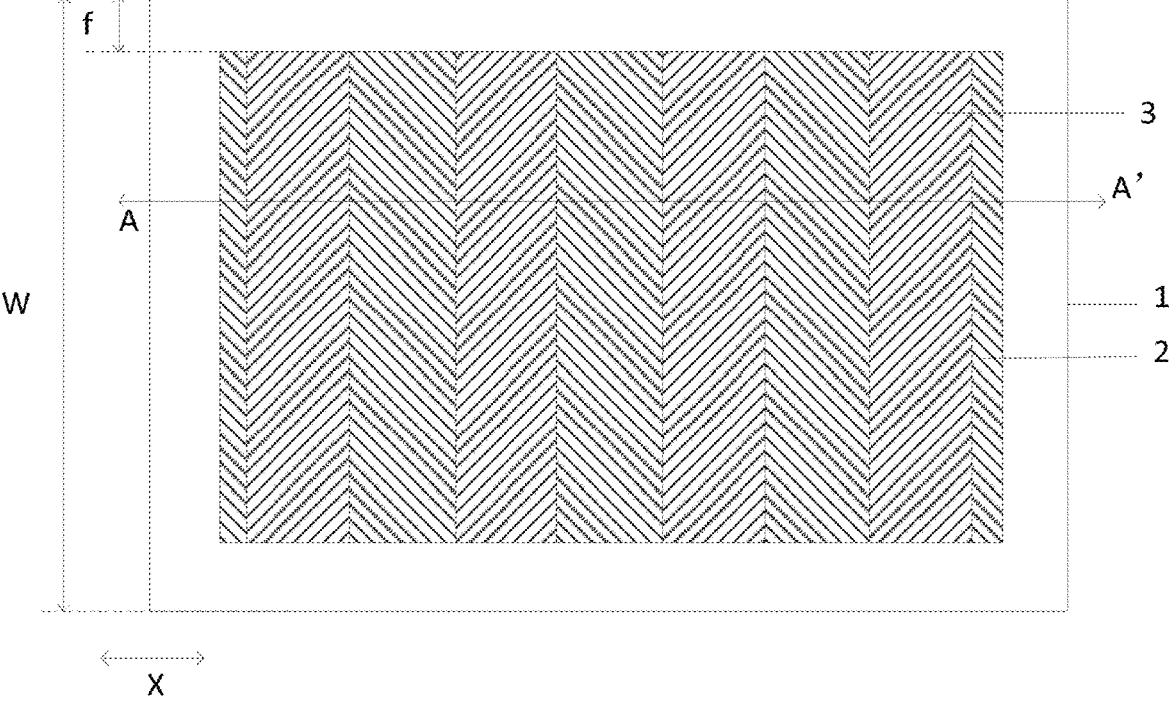
FIG. 1 is a schematic structural diagram of a flexible battery according to an embodiment of the present disclosure.

In order to make the objectives, technical solutions and advantages of embodiments of the present disclosure clearer, the technical solutions in the embodiments of the present disclosure will be clearly and completely described below in combination with the accompanying drawings in the embodiments of the present disclosure. Obviously, the embodiments described are some examples rather than all examples of the present disclosure. The embodiments in the present disclosure and the features in the embodiments can be combined with each other without conflict. On the basis of the embodiments of the present disclosure described, all other embodiments obtained by those of ordinary skill in the art without making creative efforts all fall within the scope of protection of the present disclosure.

Unless otherwise defined, technical terms or scientific terms used in the present disclosure shall have the usual meanings understood by those of general skills in the field to which the present disclosure belongs. "First", "second" and similar words used in the present disclosure do not mean any order, quantity or importance, but are only used for distinguishing different components. Similar words of "comprise", "include", etc. mean that elements or items appearing before the word encompass elements or items listed after the word and their equivalents without excluding other elements or items. Similar words of "connecting", "connection", etc. are not limited to physical or mechanical connections, but can include direct or indirect electrical connections.

It should be noted that the size and shape of the figures in the accompanying drawings do not reflect true scale, and are merely intended to illustrate the present disclosure. Identical or similar reference numerals throughout denote identical or similar elements or elements having identical or similar functions.

It should be noted that in the related art, when a flexible battery is bent, in an area between energy storage units of the battery, a film layer packaging the energy storage units of the battery is likely to generate transverse stripes in an extension direction of the energy storage units of the battery. Moreover, a maximum strain of bending is large, and is usually 10% to 14.48%. The maximum strain is concentrated in areas corresponding to two ends of the energy storage unit of the battery in the extension direction, and the film layer packaging the energy storage units of the battery is likely to generate the defects, such as bubbles and cracks, in the area, resulting in package failure and liquid leakage of the energy storage unit of the battery, thereby affecting service life of the flexible battery.

Figure 2:
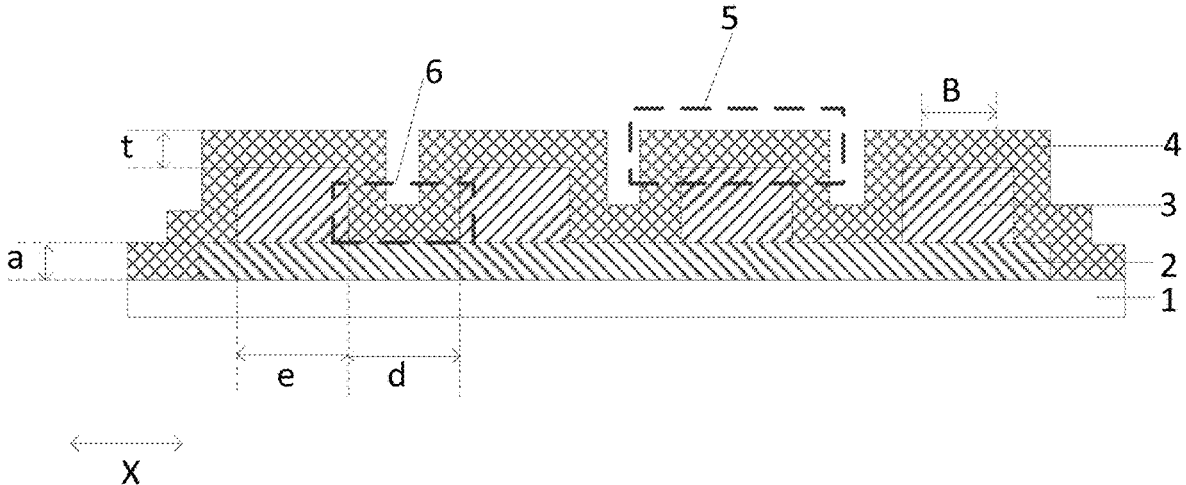
FIG. 2 is a sectional view along AA' in FIG. 1 according to an embodiment of the present disclosure.

On the basis of the above problem in the related art, a flexible battery is provided in embodiments of the present disclosure. As shown in FIG. 1 and FIG. 2, the flexible battery includes:

a supporting layer 1;

a flexible conductive layer 2, which is located on one side of the supporting layer 1;

a plurality of energy storage elements 3, which are arranged at intervals, in a first direction X, on a side of the flexible conductive layer 2 that is away from the supporting layer 1, and are electrically connected to the flexible conductive layer 2; and a first package structure 4, which includes a protruding portion 5 covering the energy storage elements 3 and a recessed portion 6 located between the adjacent energy storage elements 3, where an elastic modulus of the first package structure 4 ranges from the range of 30 MPa to 100 MPa.

It should be noted that FIG. 2 may be a sectional view along AA' in FIG. 1, for example. In order to clearly illustrate a projection relation among an energy storage element, a flexible conductive layer and a supporting layer, a first package structure is not shown in FIG. 1.

According to the flexible battery provided in the embodiment of the present disclosure, the elastic modulus of the first package structure packaging the energy storage element ranges from 30 MPa to 100 MPa. Compared with the related art, the elastic modulus of the first package structure is improved such that a maximum strain of bending can be reduced, a position of the maximum strain of bending can further be changed to avoid concentration of the maximum strain of bending at two ends of the extension direction of the energy storage element, and the defects, such as bubbles and cracks, in the first package structure during a bending process can be avoided. Further, transverse bent lines are prevented from being generated on the first package structure between adjacent energy storage elements. Liquid leakage of the energy storage element caused by package failure is avoided. Accordingly, the yield of the flexible battery is improved, and service life of the flexible battery is prolonged.

In some embodiments, an elastic modulus of the first package structure ranges from 40 MPa to 50 MPa.

According to the flexible battery provided in the embodiments of the present disclosure, compared with the related art, the elastic modulus of the first package structure is improved such that a maximum strain of bending can be reduced. A position of the maximum strain of bending can further be changed to avoid concentration of the maximum strain of bending at two ends of the extension direction of the energy storage element, and the defects, such as bubbles and cracks, in the first package structure during a bending process can be avoided. The first package structure can further be prevented from generating bent transverse stripes between adjacent energy storage elements to avoid liquid leakage of the energy storage element caused by package failure, thereby improving the yield of the flexible battery, and prolonging service life of the flexible battery.

Figure 3:
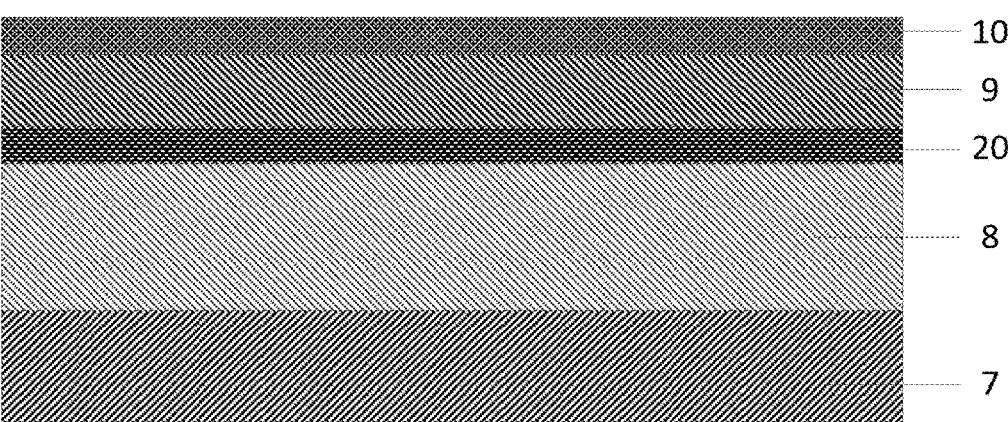
FIG. 3 is a schematic diagram of a first package structure according to an embodiment of the present disclosure.

In some embodiments, as shown in FIG. 3, the first package structure includes:

a first barrier layer 7;

a first metal layer 8, which is located on a side of the first barrier layer 7 that is away from the energy storage element;

a first bonding layer 20, which is located on a side of the first metal layer 8 that is away from the first barrier layer 7;

a second barrier layer 9, which is located on a side of the first bonding layer 20 that is away from the first metal layer 8; and a third barrier layer 10, which is located on a side of the second barrier layer 9 that is away from the first bonding layer 20.

It should be noted that FIG. 3 may be a second package structure corresponding to an area B in FIG. 2, for example.

In specific implementation, a material of each film layer in the first package structure may be selected to improve the elastic modulus of the first package structure, such that an elastic modulus of the first package structure ranges from 40 MPa to 50 MPa.

In some embodiments, a material of the first barrier layer includes polypropylene, a material of the first metal layer includes aluminum, a material of the second barrier layer includes nylon, and a material of the third barrier layer includes a resin. The first bonding layer includes an adhesive, for example. That is, the first package structure may be an aluminum-plastic film. That is, the aluminum-plastic film is a composite material consisting of a metal aluminum layer and a plurality of barrier layers.

In specific implementation, the first barrier layer may be also bonded to the first metal layer by means of the adhesive. That is, the first package structure further includes a second bonding layer located between the first barrier layer and the first metal layer.

In some embodiments, a thickness of the first package structure in a direction perpendicular to the supporting layer ranges from 150 microns to 200 microns.

It should be noted that in the related art, a thickness of the first package structure ranges from 50 microns to 100 microns.

According to the flexible battery provided in the embodiment of the present disclosure, compared with the related art, the first package structure is thickened such that a maximum strain of bending can be reduced. A position of the maximum strain of bending can further be changed to avoid concentration of the maximum strain of bending at two ends of the extension direction of the energy storage element, and the defects, such as bubbles and cracks, in the first package structure during a bending process can be avoided. The first package structure can further be prevented from generating bent transverse stripes between adjacent energy storage elements to avoid liquid leakage of the energy storage element caused by package failure, thereby improving the yield of the flexible battery, and prolonging service life of the flexible battery.

In some embodiments, a thickness of the first barrier layer may range from 50 microns to 70 microns, for example; a thickness of the first metal layer may range from 65 microns to 90 microns, for example; a thickness of the first bonding layer may range from 3 microns to 5 microns, for example; a thickness of the second barrier layer may range from 25 microns to 35 microns, for example; and a thickness of the third barrier layer may range from 5 microns to 7 microns, for example.

It should be noted that in specific implementation, the first package structure may simultaneously satisfy the conditions that the elastic modulus ranges from 40 MPa to 50 MPa and the thickness in the direction perpendicular to the supporting layer ranges from 150 microns to 200 microns. As a result, the maximum strain of bending can further be reduced, and the position of the maximum strain of bending can further be changed.

Figure 4:
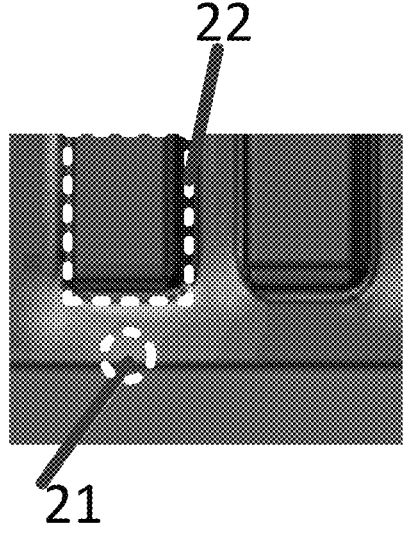
FIG. 4 is a schematic diagram of a maximum strain position of a flexible battery according to an embodiment of the present disclosure.

The first package structure simultaneously satisfies the conditions that the elastic modulus ranges from 40 MPa to 50 MPa, and the thickness in the direction perpendicular to the supporting layer ranges from 150 microns to 200 microns. The flexible battery according to the embodiment of the present disclosure is simulated, and has a maximum strain ranging from 5% to 9.96%. As shown in FIG. 4, an area 22 is an area corresponding to the energy storage element, and an area 21 having a maximum strain is no longer located in areas corresponding to two ends of the extension direction of the energy storage element. As a result, the defects, such as bubbles and cracks, in the first package structure during a bending process can be avoided to avoid liquid leakage of the energy storage element caused by package failure, thereby improving the yield of the flexible battery, and prolonging service life of the flexible battery.

In some embodiments, a thickness of a protruding portion of the first package structure in the direction perpendicular to the supporting layer is equal to a thickness of a recessed portion in the direction perpendicular to the supporting layer.

Figure 5:
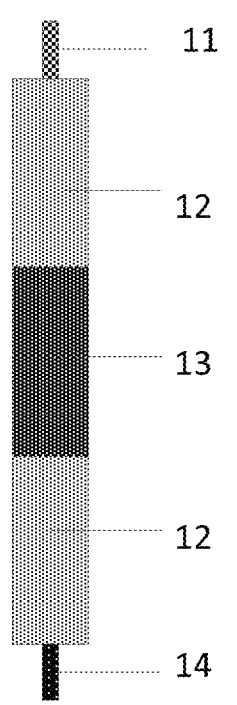
FIG. 5 is a schematic structural diagram of an energy storage element in a flexible battery according to an embodiment of the present disclosure.

In some embodiments, as shown in FIG. 5, an energy storage element includes: a positive tab 11, a roll core 12, an insulation adhesive 13, and a negative tab 14.

In specific implementation, the energy storage element may serve as a lithium battery, and the roll core of the energy storage element may be wound by means of a positive plate, a separator or a negative plate, for example. The plurality of energy storage elements may be connected by means of a flexible connection component. A material of the flexible connection component may be the same as a material of the separator, or a flexible circuit board may be utilized as the flexible connection component, for example.

Figure 6:
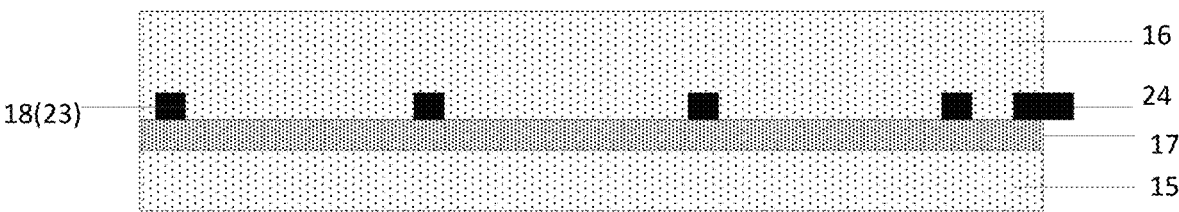
FIG. 6 is a schematic structural diagram of a flexible conductive layer in a flexible battery according to an embodiment of the present disclosure.

In some embodiments, as shown in FIG. 6, a flexible conductive layer includes: a third bonding layer 15, a fourth bonding layer 16, and a conductive layer 17 located between the third bonding layer 15 and the fourth bonding layer 16.

In specific implementation, the third bonding layer and the fourth bonding layer include an adhesive material. The adhesive material may be a polymer compound, which insulates the conductive layer from an energy storage element in an area outside electrical connection in a flexible battery, for example, and further has an effect of improving mechanical performance of the conductive layer and coating the conductive layer. In specific implementation, the adhesive material may be attached or evaporated on the conductive layer to form a bonding layer, or a metal may be sputtered on the adhesive material to form the conductive layer.

In specific implementation, as shown in FIG. 6, the conductive layer 17 is welded to a plurality of sub-tabs 18. The plurality of sub-tabs 18 include a plurality of positive sub-tabs 23 and a plurality of negative sub-tabs (not shown). A group of positive sub-tabs 23 and negative sub-tabs are located at two ends in the extension direction of the energy storage element respectively. Each positive sub-tab 23 is electrically connected to a positive tab of one energy storage element. Each negative sub-tab is electrically connected to a negative tab of one energy storage element. The plurality of positive sub-tabs 23 are electrically connected to each other, the plurality of negative sub-tabs are electrically connected to each other, and positive electrodes are connected to negative electrodes respectively, such that a plurality of energy storage elements are connected in parallel. The conductive layer further includes a first tab 24 and a second tab (not shown). The first tab 24 is electrically connected to the plurality of positive sub-tabs 23, the second tab is electrically connected to the plurality of negative sub-tabs, and the first tab and the second tab are used as the positive tab and the negative tab of the flexible battery respectively.

In some embodiments, a supporting layer includes an aluminum-plastic film or a steel-plastic film.

In specific implementation, a structure of the aluminum-plastic film used as the supporting layer may be the same as a structure of the aluminum-plastic film used as the first package structure. That is, a composite material consisting of a metal aluminum layer and a plurality of barrier layers may be used as the supporting layer.

In specific implementation, the steel-plastic film may be a composite material consisting of a stainless steel layer and the plurality of barrier layers, for example. Specifically, the steel-plastic film may be formed by compounding polypropylene, stainless steel, nylon, and a resin, and the polypropylene, the stainless steel, the nylon, and the resin may be bonded by means of an adhesive.

In specific implementation, the supporting layer not only supports the film layer located on any side of the supporting layer, but also is used as a lower package structure to package the energy storage element and the flexible conductive layer together with the first package structure.

Figure 7:
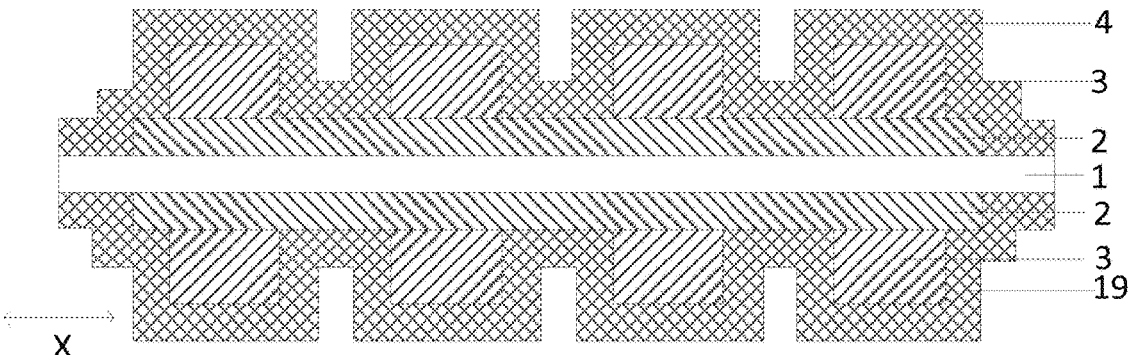
FIG. 7 is a schematic structural diagram of another flexible battery according to an embodiment of the present disclosure.

In some embodiments, as shown in FIG. 7, the flexible battery further includes:

a second package structure 19, which is located on a side of the supporting layer 1 that is away from the first package structure 4, where an elastic modulus of the second package structure 10 ranges from 30 MPa to 100 MPa; and the flexible conductive layer 2 is further located on a side of the supporting layer 1 close to the second package structure 19, and the plurality of energy storage elements 3 are further located on a side of the flexible conductive layer 2 close to the second package structure 19.

That is, the flexible battery according to the embodiment of the present disclosure includes a double-layer energy storage element, which can improve a capacity of the flexible battery.

In some embodiments, orthographic projections of two groups of energy storage elements located on two sides of a supporting layer respectively in the supporting layer coincide.

In some embodiments, a second package structure includes the same specific film layer as a first package structure. That is, the second package structure includes a first barrier layer, a first metal layer, a first bonding layer, a second barrier layer and a third barrier layer.

In some embodiments, a first package structure includes the same material as a second package structure. For example, the first package structure and the second package structure may be both aluminum-plastic films.

In some embodiments, an elastic modulus of the first package structure ranges from 40 MPa to 50 MPa.

In some embodiments, a thickness of the first package structure in a direction perpendicular to the supporting layer ranges from 150 microns to 200 microns.

In some embodiments, a first package structure and a second package structure have the same elastic modulus and thickness.

In some embodiments, as shown in FIGS. 1, 2 and 7, a distance between any two adjacent energy storage elements is equal in a first direction.

In some embodiments, a battery capacity $C_{unit}$ of each of the energy storage elements satisfies the following condition:

$$C_{unit} = \Delta \times t \times e \times (W - f) \qquad \text{Equation 1,}$$

wherein $\Delta$ is a volume energy density of the energy storage element, t is a thickness of the first conductive layer, e is a width of the energy storage element in the first direction, W is a width of the supporting layer in the direction perpendicular to the first direction, and f is a distance between an edge of the supporting layer extending in the first direction and the energy storage element.

When the thickness of the conductive layer, the width of the energy storage element in the first direction, the width of the supporting layer in the direction perpendicular to the first direction, and the distance between the edge of the supporting layer and the energy storage element satisfy the above Equation 1 under the condition that the battery capacity of the energy storage element is determined, bending performance of the flexible battery can be improved, and service life of the flexible battery can be prolonged.

In some embodiments, a width e of the energy storage element in the first direction satisfies the following condition:

$$e = \frac{C_{unit}}{\Delta \times t \times (W - f)} + a, \qquad \text{Equation 2}$$

where $C_{unit}$ is a battery capacity of each of the energy storage elements, $\Delta$ is a volume energy density of the energy storage element, t is a thickness of the first conductive layer, W is a width of the supporting layer in the direction perpendicular to the first direction, f is a distance between an edge of the supporting layer extending in the first direction and the energy storage element, and a is a thickness of the first package structure in the direction perpendicular to the flexible conductive layer.

When the battery capacity of the energy storage element, the thickness of the conductive layer, the width of the supporting layer in the direction perpendicular to the first direction, and the distance between the edge of the supporting layer and the energy storage element satisfy the above Equation 2 under the condition that the width of the energy storage element in the first direction is determined, bending performance of the flexible battery can be improved, and service life of the flexible battery can be prolonged.

In some embodiments, a battery capacity $C_{unit}$ of each of the energy storage elements satisfies the following condition:

$$C_{unit} = \frac{C_{total}}{N}, \qquad \text{Equation 3}$$

where $C_{total}$ is a total capacity of the flexible battery, and N is the number of energy storage elements.

In specific implementation, the battery capacity of each of the energy storage elements may be determined according to the total capacity of the battery and the total number of the energy storage elements.

In some embodiments, a minimum bending radius r of the flexible conductive layer, a distance d between two adjacent energy storage elements, and a width e of the energy storage element in the first direction satisfy the following condition:

$$2 \sin\left(\frac{d}{4\rho} + \frac{1}{2}\alpha\right) - \sin\alpha - \frac{dr - es}{2\rho(s + r)}\cos\alpha = 0. \qquad \text{Equation 4}$$

Figure 8:
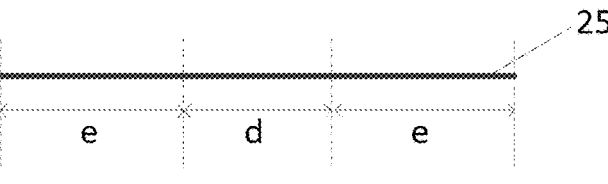
FIG. 8 is a schematic diagram of a geometric relation of a flexible battery in an unbent state according to an embodiment of the present disclosure.
Figure 9:
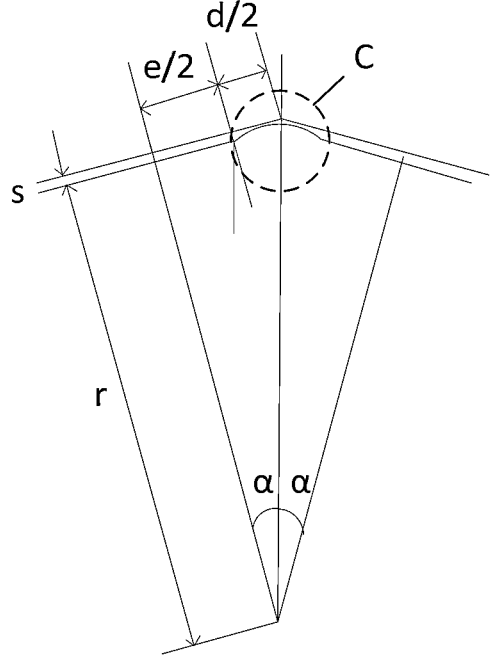
FIG. 9 is a schematic diagram of a geometric relation of a flexible battery in a bent state according to an embodiment of the present disclosure.
Figure 10:
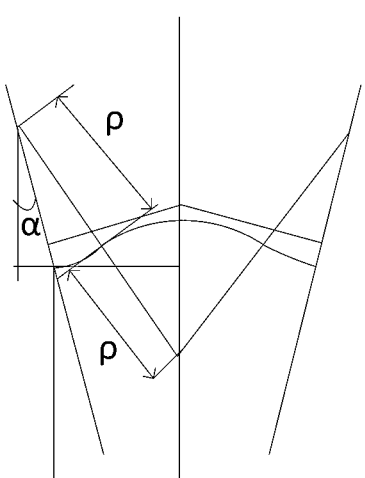
FIG. 10 is an enlarged schematic diagram of a region D in FIG. 9 according to an embodiment of the present disclosure.

Geometric relations between a horizontal state and a bent state of a flexible battery are shown in FIGS. 8, 9 and 10 respectively. FIG. 10 is an enlarged schematic diagram of an area C in FIG. 9. d is a distance between two adjacent energy storage elements, s is a distance between a neutral surface of the flexible conductive layer in a bent state and an unbent state, $\alpha$ is an included angle between two adjacent energy storage elements on two sides of a bending position in the bent state of the flexible conductive layer, and $\rho$ is a local bending radius of the flexible conductive layer.

It should be noted that the neutral surface of the flexible conductive layer may be understood as a surface on which the flexible conductive layer is located. The local bending radius of the flexible conductive layer is related to a specific stack structure of the flexible battery, and may be determined by means of a local bending test.

According to the flexible battery provided in the embodiment of the present disclosure, the minimum bending radius r of the flexible conductive layer, the distance d between two adjacent energy storage elements, and the width e of the energy storage element in the first direction satisfy the above Equation 4, such that bending performance of the flexible battery can be further improved, and the flexible battery can resist multiple high-frequency bending, thereby prolonging service life of the flexible battery.

It should be noted that Equations 1, 2, 3, and 4 described above are applicable to both the flexible battery including the single-layer energy storage element and the flexible battery including the double-layer energy storage element.

Figure 11:
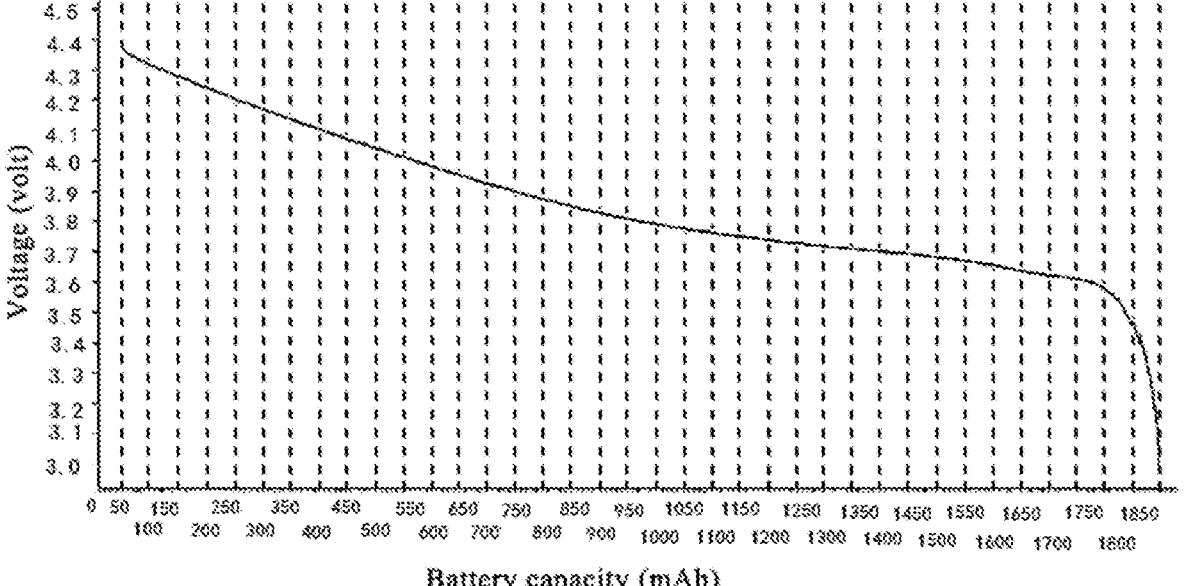
FIG. 11 is a graph of a relation between a discharge voltage and a battery capacity of a flexible battery according to an embodiment of the present disclosure.
Figure 12:
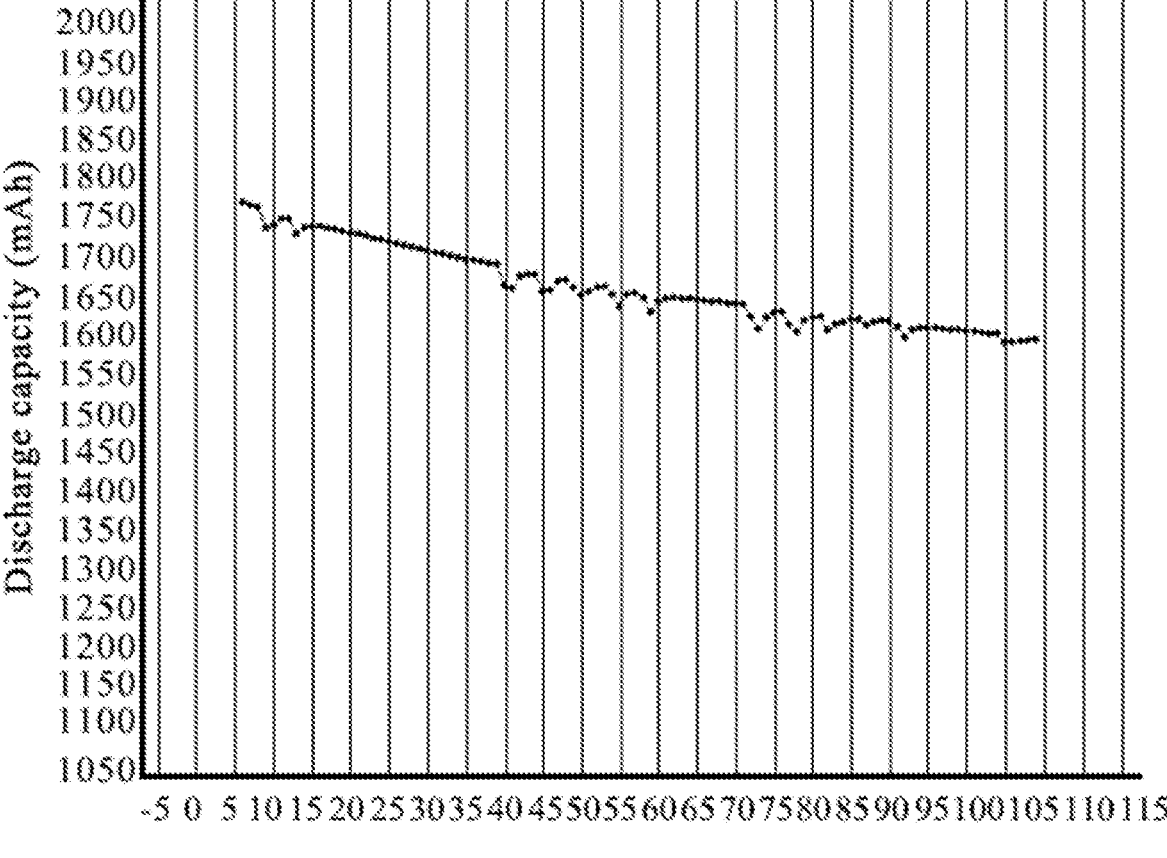
FIG. 12 is a graph of a test result of cycle life of a flexible battery according to an embodiment of the present disclosure.

It should be noted that in FIGS. 2 and 7, a section of the energy storage element being rectangular will be described as an example. In specific implementation, the section of the energy storage element generally presents a rounded rectangular shape. Next, the flexible battery according to the embodiment of the present disclosure is stimulated by taking the section of the energy storage element being a rounded rectangle as a model. A minimum bending radius r of a flexible conductive layer is 15 mm±5 mm, a width e of an energy storage element in a first direction is 9 mm±3 mm, and when a distance d between two adjacent energy storage elements is 8 mm±2 mm, a battery capacity is about 900 mAh±100 mAh, and a simulation result is shown in FIGS. 11 and 12. FIG. 11 shows a relation between a discharge voltage and a discharge capacity of a flexible battery. A rated capacity of the flexible battery model is about 1750 mAh. FIG. 12 shows test results of cycle life, i.e., a relation between the number of times of cycle discharge and a discharge capacity. A discharge capacity decay of 100 cycles is within 10%.

Figures 13, 14:
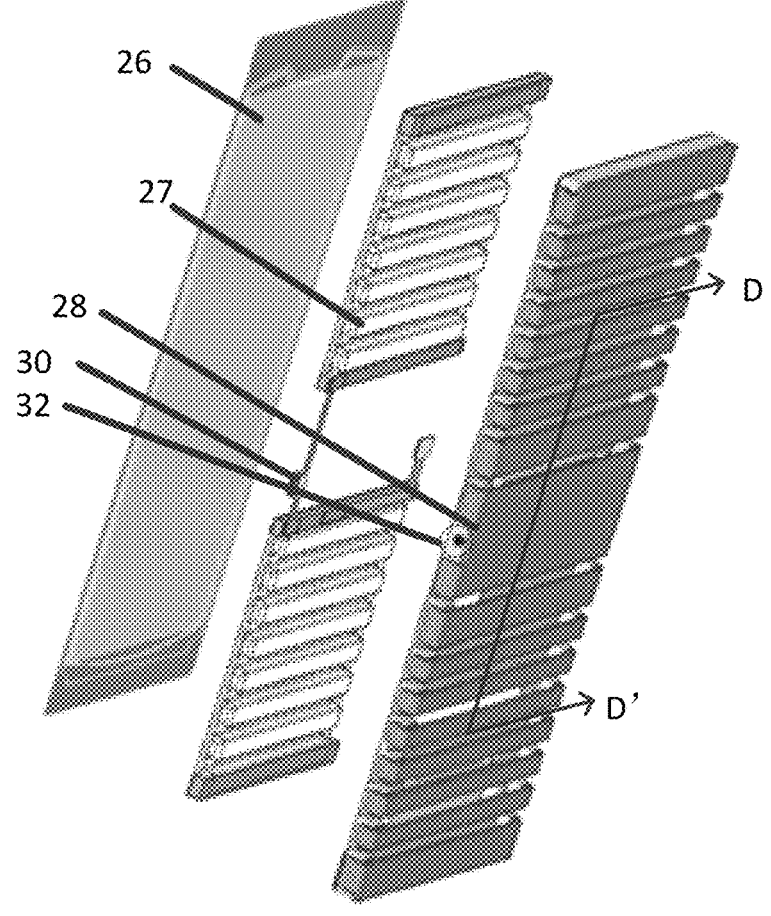
FIG. 13 is a schematic structural diagram of a display apparatus according to an embodiment of the present disclosure.
FIG. 14 is a sectional view along DD' in FIG. 13 according to an embodiment of the present disclosure.

As shown in FIG. 13, a display apparatus according to an embodiment of the present disclosure includes: a display substrate 26; and the flexible battery 27 according to the embodiment of the present disclosure that is located on one side of the display substrate 26.

In some embodiments, as shown in FIG. 13, the display apparatus further includes: a casing 28, which is located on the side of the flexible battery 27 that is away from the display substrate 26, and is located on the side of the first package structure that is away from the supporting layer.

In some embodiments, as shown in FIG. 14, the casing is provided with a plurality of first recesses 29 accommodating the protruding portion of the first package structure.

Thus, a shape of the casing can match a shape of the flexible battery, such that the assembly of the casing and the flexible battery is facilitated.

It should be noted that the display module, the flexible battery, and the casing in FIG. 13 are not assembled, so as to clearly show a position relation of the display module, the flexible battery and the casing. FIG. 14 may be a sectional view along DD' in FIG. 13, for example.

In specific implementation, when the flexible battery is assembled to the casing, the protruding portion of the flexible battery is placed into the first recess of the casing.

In specific implementation, in the first direction, the width of the first recess is greater than the width of the protruding portion of the flexible battery, and the width between two adjacent first recesses is less than the width of two adjacent protruding portions of the flexible battery. As a result, when that flexible battery is assembled to the casing, the casing can accommodate the flexible battery.

In some embodiments, as shown in FIG. 13, the display apparatus includes the plurality of flexible batteries on one side of the display substrate, where the plurality of flexible batteries are located on the same plane, and the plurality of flexible batteries are electrically connected to each other by means of a flexible circuit board 30.

It should be noted that in FIG. 13, a display apparatus including two flexible batteries is described as an example. On one side of a display module, two flexible batteries are arranged in a first direction and are electrically connected by means of a flexible circuit board.

In some embodiments, as shown in FIG. 14, the casing is further provided with a second recess 31, and an orthographic projection of the second recess 31 on the display substrate covers an area between two adjacent flexible batteries; and the display apparatus further includes: a main board (not shown), which is electrically connected to the flexible circuit board, and is located in the second recess 31.

In some embodiments, as shown in FIG. 13, two side surfaces of the second recess parallel to the first direction are provided with a first opening 32 and a second opening (not shown) respectively; the first opening 32 exposes a startup button of the main board; and the second opening exposes a charging end of the main board.

In specific implementation, a display substrate may be a flexible display substrate, for example. Since the display apparatus includes the flexible battery according to the embodiment of the present disclosure, rolled display, folded display, etc. can be achieved.

The display apparatus according to the embodiment of the present disclosure is any product or component having a display function such as a mobile phone. Other essential components of the display apparatus should be understood by those of ordinary skill in the art, which is not repeated herein, and should not be used as limitations to the present disclosure. For implementation of the display apparatus, reference may be made to the embodiment of the flexible battery described above, which will not be repeated.

A wearable device according to an embodiment of the present disclosure includes the flexible battery according to the embodiment of the present disclosure on one side of the display substrate.

The wearable device provided in the embodiment of the present disclosure can be a device such as a smart bracelet and a smartwatch.

To sum up, according to the flexible battery, the display apparatus and the wearable device provided in the embodiments of the present disclosure, the elastic modulus of the first package structure packaging the energy storage element ranges from 30 MPa to 100 MPa such that a maximum strain of bending can be reduced. A position of the maximum strain of bending can further be changed to avoid concentration of the maximum strain of bending at two ends of the extension direction of the energy storage element, and the defects, such as bubbles and cracks, in the first package structure during a bending process can be avoided. The first package structure can further be prevented from generating bent transverse stripes between adjacent energy storage elements to avoid liquid leakage of the energy storage element caused by package failure, thereby improving the yield of the flexible battery, and prolonging service life of the flexible battery.

Apparently, those skilled in the art can make various modifications and variations to the present disclosure without departing from the spirit and scope of the present disclosure. In this way, if these modifications and variations of the present disclosure fall within the scope of the claims of the present disclosure and equivalent technologies of the claims, the present disclosure is also intended to encompass these modifications and variations.

What is claimed is:

1. A flexible battery, comprising:
a supporting layer;
a flexible conductive layer on a side of the supporting layer;
a plurality of energy storage elements, arranged at intervals in a first direction on a side of the flexible conductive layer away from the supporting layer, and electrically connected to the flexible conductive layer; and
a first package structure, comprising a protruding portion covering the energy storage elements and a recessed portion between the adjacent energy storage elements, wherein an elastic modulus of the first package structure ranges from 30 MPa to 100 MPa.

2. The flexible battery according to claim 1, wherein the elastic modulus of the first package structure ranges from 40 MPa to 50 MPa.

3. The flexible battery according to claim 1, wherein a thickness of the first package structure in a direction perpendicular to the supporting layer ranges from 150 microns to 200 microns.

4. The flexible battery according to claim 1, wherein the first package structure comprises:
a first barrier layer;
a first metal layer on a side of the first barrier layer away from the energy storage element;

a first bonding layer on a side of the first metal layer away from the first barrier layer;

a second barrier layer on a side of the first bonding layer away from the first metal layer; and a third barrier layer on a side of the second barrier layer away from the first bonding layer.

5. The flexible battery according to claim 4, wherein a material of the first barrier layer comprises polypropylene, a material of the first metal layer comprises aluminum, a material of the second barrier layer comprises nylon, and a material of the third barrier layer comprises a resin.

6. The flexible battery according to claim 1, further comprising:

a second package structure on a side of the supporting layer away from the first package structure, wherein an elastic modulus of the second package structure ranges from 30 MPa to 100 MPa;

wherein the flexible conductive layer is further on a side of the supporting layer close to the second package structure, and the plurality of energy storage elements are further on a side of the flexible conductive layer close to the second package structure.

7. The flexible battery according to claim 1, wherein a distance between any two adjacent energy storage elements is equal in the first direction.

8. The flexible battery according to claim 7, wherein a battery capacity $C_{unit}$ of each of the energy storage elements satisfies the following condition:

$$C_{unit}=\Delta \times t \times e \times (W-f),$$

wherein $\Delta$ is a volume energy density of the energy storage element, t is a thickness of the first conductive layer, e is a width of the energy storage element in the first direction, W is a width of the supporting layer in a direction perpendicular to the first direction, and f is a distance between an edge of the supporting layer extending in the first direction and the energy storage element.

9. The flexible battery according to claim 7, wherein a width e of the energy storage element in the first direction satisfies the following condition:

$$e = \frac{c_{unit}}{\Delta \times t \times (W-f)} + a,$$

wherein $C_{unit}$ is a battery capacity of each of the energy storage elements, $\Delta$ is a volume energy density of the energy storage element, t is a thickness of the first conductive layer, W is a width of the supporting layer in a direction perpendicular to the first direction, f is a distance between an edge of the supporting layer extending in the first direction and the energy storage element, and a is a thickness of the first package structure in a direction perpendicular to the flexible conductive layer.

10. The flexible battery according to claim 7, wherein a battery capacity $C_{unit}$ of each of the energy storage elements satisfies the following condition:

$$C_{unit} = \frac{c_{total}}{N},$$

wherein $C_{total}$ is a total capacity of the flexible battery, and N is a quantity of energy storage elements.

11. The flexible battery according to claim 7, wherein a minimum bending radius r of the flexible conductive layer, a distance d between two adjacent energy storage elements, and a width e of the energy storage element in the first direction satisfy the following condition:

$$2 \sin\left(\frac{d}{4\rho} + \frac{1}{2}\alpha\right) - \sin \alpha - \frac{dr - es}{2\rho(s+r)}\cos \alpha = 0,$$

wherein s is a distance between a neutral surface of the flexible conductive layer in a bent state and an unbent state, $\alpha$ is an included angle between two adjacent energy storage elements on two sides of a bending position in the bent state of the flexible conductive layer, and $\rho$ is a local bending radius of the flexible conductive layer.

12. A display apparatus, comprising a display substrate; and a flexible battery on a side of the display substrate, wherein the flexible battery comprises:

a supporting layer;

a flexible conductive layer on a side of the supporting layer;

a plurality of energy storage elements, arranged at intervals in a first direction on a side of the flexible conductive layer away from the supporting layer, and electrically connected to the flexible conductive layer; and a first package structure, comprising a protruding portion covering the energy storage elements and a recessed portion between the adjacent energy storage elements, wherein an elastic modulus of the first package structure ranges from 30 MPa to 100 MPa.

13. The display apparatus according to claim 12, further comprising:

a casing on a side of the flexible battery away from the display substrate, and on a side of the first package structure away from the supporting layer.

14. The display apparatus according to claim 13, wherein the casing is provided with a plurality of first recesses accommodating the protruding portion of the first package structure.

15. The display apparatus according to claim 13, comprising a plurality of flexible batteries on one side of the display substrate, wherein the plurality of flexible batteries are on a same plane, and the plurality of flexible batteries are electrically connected to each other by means of a flexible circuit board.

16. The display apparatus according to claim 15, wherein the casing is further provided with a second recess, and an orthographic projection of the second recess on the display substrate covers an area between two adjacent flexible batteries; and the display apparatus further comprises:

a main board, electrically connected to the flexible circuit board, and located in the second recess.

17. The display apparatus according to claim 16, wherein two side surfaces of the second recess parallel to the first direction are provided with a first opening and a second opening respectively;

the first opening exposes a startup button of the main board; and the second opening exposes a charging end of the main board.

18. A wearable device, comprising a flexible battery on one side of a display substrate, wherein the flexible battery comprises:

a supporting layer;

a flexible conductive layer on a side of the supporting layer;

a plurality of energy storage elements, arranged at intervals in a first direction on a side of the flexible conductive layer away from the supporting layer, and electrically connected to the flexible conductive layer; and a first package structure, comprising a protruding portion covering the energy storage elements and a recessed portion between the adjacent energy storage elements, wherein an elastic modulus of the first package structure ranges from 30 MPa to 100 MPa.

* * * * *